United States Patent
Mallecot et al.

(10) Patent No.: US 7,167,498 B2
(45) Date of Patent: Jan. 23, 2007

(54) MULTI SECTION ELECTROOPTIC MONOLITHIC COMPONENT

(75) Inventors: Franck Mallecot, Montrouge (FR); Christine Chaumont, Villejuif (FR); Joël Jacquet, Limours (FR); Arnaud Leroy, Paris (FR); Antonina Plais, Paris (FR); Joe Harari, Sebourg (FR); Didier Decoster, Leers (FR)

(73) Assignee: Avanex Corporation, Fremont, CA (US)

( * ) Notice: Subject to any disclaimer, the term of this patent is extended or adjusted under 35 U.S.C. 154(b) by 237 days.

(21) Appl. No.: 10/845,772

(22) Filed: May 14, 2004

(65) Prior Publication Data
US 2004/0264516 A1 Dec. 30, 2004

Related U.S. Application Data

(63) Continuation of application No. PCT/FR02/03927, filed on Nov. 15, 2002.

(51) Int. Cl.
*H01S 5/00* (2006.01)

(52) U.S. Cl. ............... 372/50.21; 372/43.01; 372/45.01; 372/45.012; 372/50.1; 385/14; 385/50; 385/129; 385/130; 385/131; 385/141; 398/135; 398/138; 398/139; 257/81; 257/82; 257/83; 257/84; 257/85

(58) Field of Classification Search ............ 372/43.01, 372/45.01, 45.012, 50.1, 50.21; 385/14, 385/50, 129–131, 141; 398/135, 138, 139; 257/81–85
See application file for complete search history.

(56) References Cited

U.S. PATENT DOCUMENTS

| | | | | |
|---|---|---|---|---|
| 5,031,188 | A * | 7/1991 | Koch et al. ............. | 372/50.11 |
| 5,054,871 | A * | 10/1991 | Deri et al. ............. | 385/30 |
| 5,555,108 | A * | 9/1996 | Babbitt et al. ........... | 359/12 |
| 5,712,864 | A * | 1/1998 | Goldstein et al. ........ | 372/50.21 |
| 6,023,063 | A * | 2/2000 | Norton ................. | 250/338.4 |
| 6,148,015 | A | 11/2000 | Jacquet et al. | |
| 6,208,794 | B1 * | 3/2001 | Mallecot et al. ......... | 385/131 |
| 6,521,471 | B1 * | 2/2003 | Mallecot et al. ......... | 438/24 |
| 6,521,968 | B2 * | 2/2003 | Kuhara et al. ........... | 257/461 |
| 6,972,904 | B2 * | 12/2005 | Bratt et al. ............. | 359/558 |
| 2004/0233531 | A1 * | 11/2004 | Bratt et al. ............. | 359/558 |

FOREIGN PATENT DOCUMENTS

EP  0 999 825  2/1999
EP  1 081 814  3/2001

* cited by examiner

*Primary Examiner*—Minsun Oh Harvey
*Assistant Examiner*—Hrayr A. Sayadian
(74) *Attorney, Agent, or Firm*—Patterson & Sheridan, LLP

(57) ABSTRACT

A semiconductor electrooptic monolithic component comprising successively a first section capable of emitting light at a first wavelength and including a first active layer, a second section capable of absorbing light at the said first wavelength and including a second active layer, and a third section capable of detecting light at a second wavelength and including a third active layer. The component is characterized in that the second active layer is designed to ensure in the said second section an absorption higher than that which would be allowed by an active layer identical to the said first layer.

20 Claims, 2 Drawing Sheets

MULTI SECTION ELECTROOPTIC MONOLITHIC COMPONENT

CROSS-REFERENCE TO RELATED APPLICATIONS

This application is a continuation of co-pending PCT patent application No. PCT/FR02/03927, filed Nov. 15, 2002, which claims the benefit of French patent application serial number 01 14 760, filed Nov. 15, 2001. Each of the aforementioned related patent applications is herein incorporated by reference in their entireties.

BACKGROUND OF THE INVENTION

Field of the Invention

The present invention relates to a semiconductor electrooptic monolithic component comprising at least three sections, each having a waveguide etched in the form of a stripe and buried in a cladding layer.

The invention relates more particularly to any electrooptic component comprising at least one transmitter element and at least one receiver element that are integrated, which can operate simultaneously in transmit/receive mode without generating disturbing interactions between the transmitter and the receiver.

In addition, it is desired to manufacture this type of component on a large scale so as to minimize its manufacturing cost.

Furthermore, some of these components, of the in-line transmitter/receiver type, are intended to be installed in fibre-optic distribution networks, especially at the premises of subscribers and must then be able to operate between about 0 and 70° C. without any temperature regulation.

A component that meets these criteria is disclosed in Patent Application EP 0 992 825.

SUMMARY OF THE INVENTION

An example of such a component is shown schematically in FIG. 1: this is an in-line transmitter/receiver obtained by monolithic integration of a laser 30 and a detector 20 on one and the same substrate 10. The laser 30 transmits a signal to an optical fibre 50 for example, while the detector 20 receives a signal coming from this same optical fibre.

However, the laser 30 also transmits in the direction of the detector 20. Now, when the transmit wavelength of the laser 30 lies within the absorption spectrum of the detector 20, and when the laser 30 is located near the detector 20, the light coming from the laser 30 is also detected by the detector 20.

If, for example, the component is installed at the premises of a subscriber, the transmit wavelength is close to 1.3 µm, while the receive wavelength is close to 1.55 µm. The laser may then introduce optical perturbations on the detector. This is because the laser also emits light at about 1.3 µm in the direction of the detector, which light will blind the latter. To avoid this detector blinding, the component includes a third section, placed between the laser 30 and the detector 20, which forms an optical isolator 40. This optical isolator allows the light emitted at about 1.3 µm and transmitted in the direction of the detector to be absorbed, so that the latter can detect the optical signal at about 1.55 µm coming from the optical fibre without being perturbed by the laser.

The substrate 10 or lower layer may for example be n-doped InP. The waveguides 21 of the detector 20 and 31 of the laser 30 and of the optical isolator 40 are etched in the form of stripes and buried in a highly doped upper cladding layer 11. The cladding material 11 is $p^+$-doped when the substrate is n-doped, or vice versa.

Metal electrodes 23, 33, 43 and 13 are formed on the various sections and on the bottom of the component so as to allow it to operate.

The dimensions of this component are very small: the length of the laser 30 is typically around 300 µm, that of the optical absorber 40 typically 300 µm and that of the detector 20 typically 100 µm.

More precisely, the spontaneous light emitted by the laser 30 but not guided by the waveguide 31 is transmitted throughout the volume of the component. In addition, some of the stimulated light is diffracted in the component owing to the presence of optical discontinuities in the waveguide 31. All these stray light waves emitted at about 1.3 µm by the laser 30, in all directions, will perturb and blind the detector 20, which can no longer correctly detect the wavelength at about 1.55 µm. These perturbations are depicted simply by the arrow OP (Optical Perturbations) in FIG. 1.

To eliminate this unguided stray light emitted at about 1.3 µm, the transmitter/receiver described in the aforementioned patent application comprises, in one particular embodiment, a preferably n-doped absorbent layer 70n, which is placed in the n-doped lower layer 10 of the component, and a preferably p-doped absorbent layer 70p, which is placed in the p-doped upper layer 11 of the component.

Thus, the stray light whose path 71 is shown schematically is absorbed as it propagates, in such a way that it becomes very weak before it reaches the detector 20.

However, this unguided stray light is not sufficiently removed, especially if the power of the laser increases.

The curves shown in FIG. 2 demonstrate the penalties observed in the sensitivity of the detector, in dB, for various operating indices. Curve A represents a reference in receive mode when the laser is turned off, that is to say in the case for example of the component installed in the premises of a subscriber when the subscriber receives but transmits nothing; curve B represents a reference in receive mode when the laser is on continuously, that is to say in the case of the preceding example when the subscriber receives but sends no information; curves C and D represent the simultaneous modulation of the laser and of the detector, that is to say in the case of the preceding example when the subscriber receives and sends information; in the case of curve C, the laser emits with a power of 1 mW and in the case of curve D, the laser emits with a power of 2 mW, the general tendency being to increase the emission power of the laser. Thus, there is a 3 dB penalty between curve B and curve D when the laser is modulated at the same time as the detector receives a modulated signal.

The aim of the invention as objective therefore consists in producing an inexpensive electrooptic monolithic component comprising a detector and an element capable of disturbing the detector, such as a laser, the transmit wavelength of the laser lying within the absorption spectrum of the detector, in which the 3 dB perturbation of the detector (in the example of FIG. 2), which occurs when they are simultaneously modulated, is considerably reduced.

The subject of the invention is a semiconductor electrooptic monolithic component comprising successively a first section capable of emitting light at a first wavelength and including a first active layer, a second section capable of absorbing light at the said first wavelength and including a second active layer, and a third section capable of detecting light at a second wavelength and including a third active layer, mainly characterized in that the second active layer is designed to ensure in the said second section an absorption higher than that which would be allowed by an active layer identical to the said first layer and in that the first active layer of the first section extends partly into the said second section.

According to one embodiment of the invention, the said second active layer is a bulk layer, preferably made of a quaternary material.

According to another embodiment of the invention, the second active layer is a quantum-well layer.

The component advantageously comprises beneath one face of the second active layer called the lower face, at least one "anti-reflection" layer capable of reducing light reflection on the said lower face and/or on a face of the second active layer called the upper face, at least one "anti-reflection" layer capable of reducing light reflection on the said upper face.

According to another embodiment of the invention, the second active layer extends into the third section and the said third section furthermore includes an absorbent fourth active layer which is placed above the said layer that extends into the third section and is capable of detecting the light propagated by the second active layer.

The absorbent fourth active layer is preferably made of a ternary material.

According to one particular embodiment of the invention, the first, second and third active layers are confined between an upper cladding layer and a lower cladding layer, the component comprising a first absorbent layer placed in the said lower layer and capable of absorbing all or part of the light and, optionally, on the upper face of the first absorbent layer, at least one layer capable of reducing light reflection on the said first absorbent layer.

The component may comprise, in a symmetrical manner, a second absorbent layer placed in the said upper layer and capable of absorbing all or part of the light and optionally, on the lower face of the second absorbent layer, at least one layer capable of reducing light reflection on the said second absorbent layer.

The component may constitute an in-line transmitter/receiver, the transmit wavelength of which is shorter than the receive wavelength.

BRIEF DESCRIPTION OF THE DRAWINGS

Other features and advantages of the invention will become clearly apparent on reading the description given by way of non-limiting example and with reference to the appended drawings in which.

DETAILED DESCRIPTION OF THE PREFERRED EMBODIMENT

Figure 3:
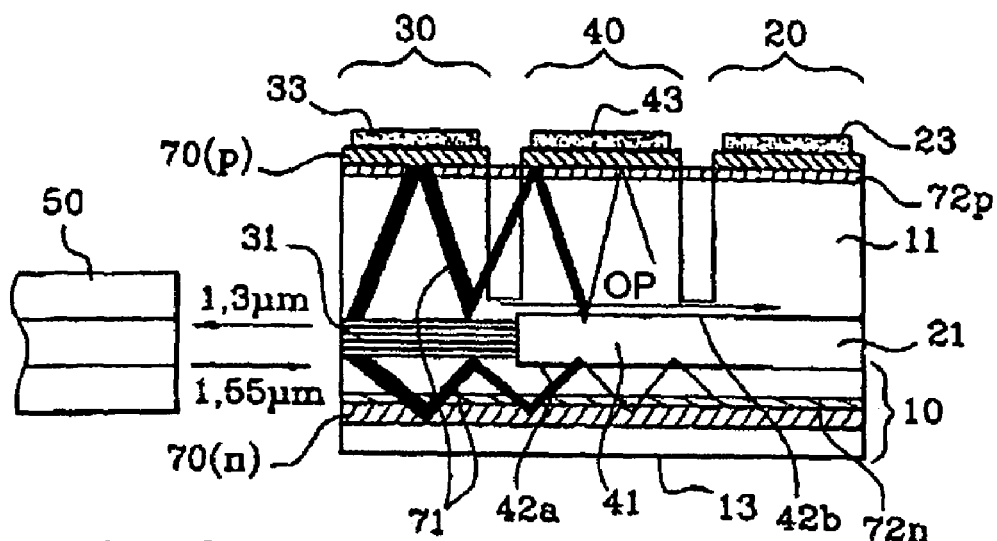
FIG. 3 shows schematically one embodiment of a transmitter/receiver according to the invention.

FIG. 3 shows schematically one embodiment of a component according to the invention. More particularly, it shows an in-line transmitter/receiver. However, the invention is not only limited to in-line transmitter/receivers, rather it applies to any integrated optoelectronic component for which crosstalk exists, that is to say to any component comprising a detector and an element liable to perturb the detector; this is the case of a laser transmitter when the transmit wavelength of the laser lies within the absorption spectrum of the detector.

Figure 1:
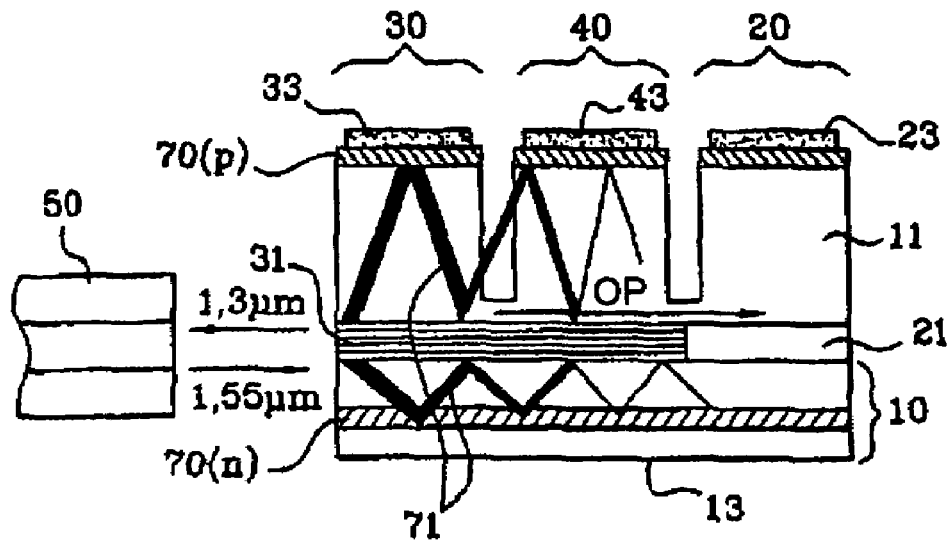
FIG. 1, already described, shows a diagram in longitudinal section of a conventional in-line transmitter/receiver component.
Figure 2:
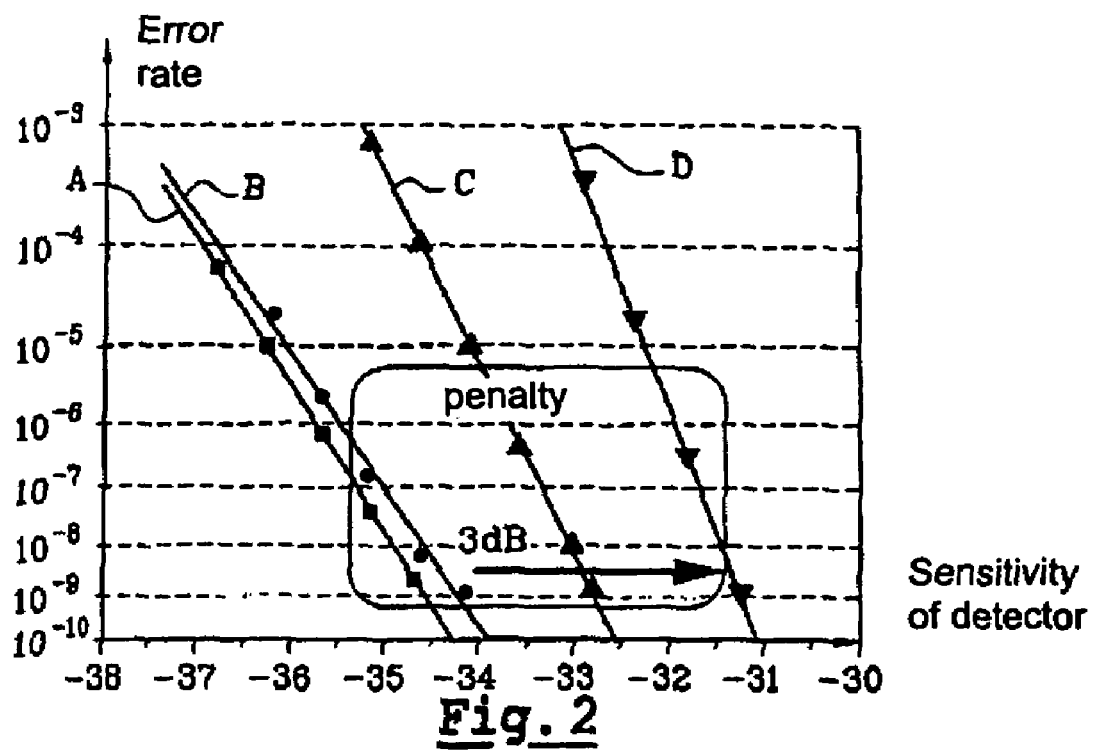
FIG. 2, already described, shows curves that demonstrate the operating penalties during simultaneous modulation of the transmitter with modulated reception by the receiver of the component of FIG. 1.

In this example, the same references are used to denote the same elements as in the conventional transmitter/receiver shown schematically in FIG. 1. The laser 30 emits at a wavelength shorter than the receive wavelength of the detector 20. The transmit wavelength is, for example, close to 1.3 µm whereas the receive wavelength is close to 1.55 µm.

To eliminate the unguided stray light emitted at about 1.3 µm, the second section 40 of the component according to the invention, in this case the section capable of absorbing this light, includes an active layer 41 allowing strong optical confinement in the latter, that is to say ensuring stronger confinement and therefore higher absorption than if a layer identical to the layer 31 were to be used, so as to increase the overlap between the unguided light and this second active layer in which the guided light propagates.

The component, more specifically the section 40 of the absorber, may also be provided with an additional improvement.

This is because the intensity of the guided light emitted at about 1.3 µm is much higher as output by the laser than the intensity of the unguided light. Now, when the active layer 31 of the laser extends into the second section 40, as in the case of the component shown in FIG. 1, the guided light emitted at about 1.3 µm is rapidly absorbed over the first 50 µm of its path. It is therefore beneficial to introduce the layer 41, as described above and which in particular is aimed at absorbing the unguided light, only when the guided light has already been largely absorbed.

Figure 4:
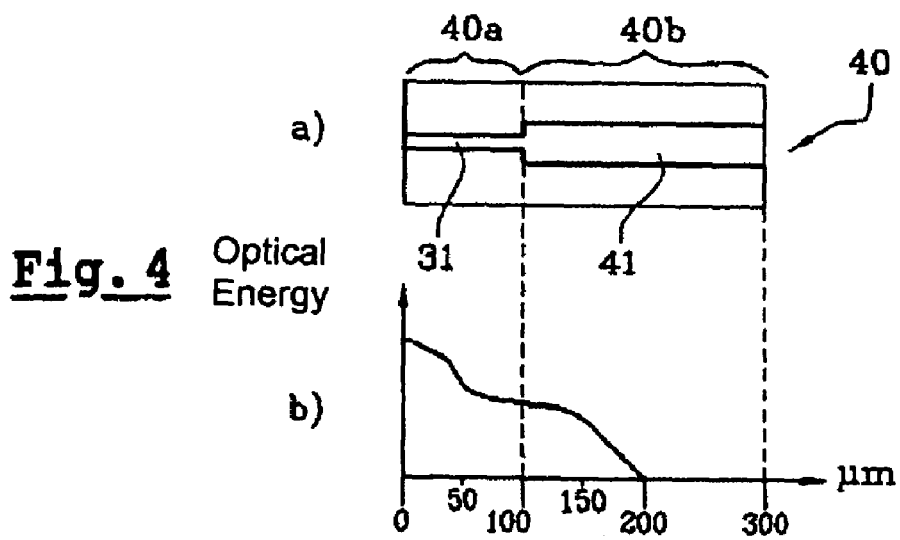
FIGS. 4a) and 4b) show, respectively, a diagram of another embodiment of the absorbent section of a transmitter/receiver according to the invention and the corresponding curves that demonstrate the absorption of the guided and unguided light emitted at about 1.3 µm.

It is for this reason that the absorber 40 of the component shown schematically in FIG. 4a) comprises two vertical structures. The first structure 40a, extending the structure of the laser, is such that the structure of the active layer 31 of the laser extends partly into the section 40; the second structure 40b, extending the first one, is that which enhances the optical confinement of the unguided light in the active layer, as described above. The reference 41 then denotes the active layer of the second structure 40b.

The first and second active layers of an in-line transmitter/receiver as described above are typically quantum-well layers.

The active layer of the laser 30 may comprise, for example, six quantum wells each of 8 nm in thickness and separated by barriers of 10 nm in thickness; the same applies in the case of the second active layer of the absorber which, for reasons of simplicity and manufacturing cost, is generally obtained at the end of the same epitaxy step as the first active layer and the structure of which is then identical to the latter. Thus, an active layer with a thickness of about 0.1 µm is obtained.

The strong optical confinement in the second layer may be obtained by choosing as second active layer 41 a bulk active layer as a replacement for the quantum-well layer.

This bulk layer is, for example, made of a quaternary material having a photoluminescence wavelength of around 1.4 µm. Since this wavelength is longer than the 1.3 µm wavelength of the laser, the light emitted by the laser is absorbed, whereas this bulk layer is transparent for the wavelength close to 1.55 µm that it is desired to detect, as it is longer than 1.4 µm.

It is also possible to increase the optical confinement in the second active layer 41 by increasing its thickness, whether the layer is a quantum-well layer or a bulk layer. When the layer is a quantum-well layer, the number of quantum wells is increased for example—the thickness may be increased to about 0.5 µm.

The structure of the absorber 40 can be improved.

This is because there is generally a large difference between the refractive indices of the various constituent materials of the component and especially those of the absorber 40. In particular, this large difference increases the reflection of the light rays (or unguided modes) emanating, for example, from the layer 11, which may be made of InP, and entering the second active layer 41, the index of which is higher than that of the InP. To further increase the absorption of the unguided mode in the guiding layer, that is to say the second active layer 41, an "anti-reflection" layer 42a and an "anti-reflection" layer 42b, that is to say a layer having an index intermediate between that of the absorber and that of the InP, is then added to the lower and/or upper faces of this second active layer 41. These "anti-reflection" layers 42a and 42b are placed on the faces of the active layer 41 of the second structure 40b.

The refractive indices, calculated at the 1.55 µm wavelength by the Broberg method, have, for example, the following values: in the case of the layer 11, which may be made of InP, a value of 3.1693; in the case of the layer 41, which may be made of a quaternary material having a photoluminescence wavelength of 1.4 µm, a value of 3.4373; and, in the case of the "anti-reflection" layer, which may be made of a quaternary material having a photoluminescence wavelength of 1.17 µm, an intermediate value of 3.3317.

The curve shown in FIG. 4b) demonstrates the absorption of the guided and unguided light emitted at about 1.3 µm as it propagates along the absorber 40, the vertical structure of which is shown schematically in FIG. 4a).

Over the length corresponding to the first structure 40a, the curve can be divided into a first curve portion from 0 to about 50 µm, corresponding mainly to the absorption of the guided light, and a second curve portion from about 50 µm to about 100 µm, which corresponds mainly to a moderate absorption of the unguided light.

Over the distance corresponding to the second structure 40b, the unguided light is absorbed between about 100 µm and about 200 µm, until no longer significantly perturbing the detector 20.

It is then possible to reduce the length of the absorber 40 from 300 µm to about 220 µm, to reduce the length of the component by a corresponding amount, and thus to reduce the manufacturing cost of the component.

In general, the active layers 41 and 21 of the absorber and of the detector are placed end to end and the active layer 21 detects the light by direct coupling.

Figure 5:
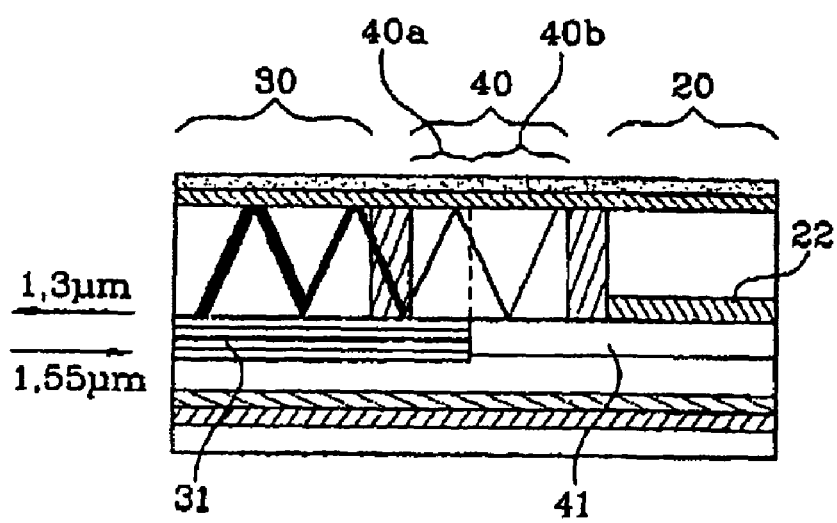
FIG. 5 shows schematically one embodiment of the invention in the case of an absorber with a vertical double structure and of an evanescent wave detector.

However, in the case shown in FIG. 5 in which the absorber 40 has a vertical double structure, the active layer 41 of the second structure 40b of the absorber extends into the section 20 of the detector for fabrication reasons. This is the reason why the section 20 of the detector includes a fourth active layer 22 comprising absorbent ternary layers, which active layer 22 is deposited on this active layer 41 that extends into the detector, so that the guided light at about 1.55 µm that propagates along the active layer 41 of the absorber is evanescently coupled with the layer 22 in order to be detected: an evanescent-wave detector is thus obtained.

According to one particular embodiment of the component, placed along the length of the component, as shown in FIG. 3, are/is an absorbent layer 70n in the said lower layer 10 and/or an absorbent layer 70p in the said upper layer 11, these layers being capable of absorbing all or part of the said unguided light.

It may be advantageous on the upper face of the layer 70n to add one or more layers 72n capable of reducing reflection of the unguided light on this upper face. Likewise, it is possible to add on the lower face of the layer 70p one or more layers 72p capable of reducing reflection of the unguided light on this upper face.

These layers 70n and 72n are, for example, doped with n-type carriers and the layers 70p and 72p doped with p-type carriers, that is to say like the corresponding lower 10 and upper 11 layers.

What is claimed is:

1. A device comprising a first section capable of emitting light at a first wavelength and including a first waveguide, a second section capable of detecting light at a second wavelength end including a second waveguide, and a middle section between the first and second sections including a third waveguide for absorbing light emitted from the first section, the third waveguide including a first absorption layer for absorbing said light at the first wavelength that is guided through the third waveguide and a second absorption layer for absorbing said light at the first wavelength that is not guided through the third waveguide better than the first absorption layer.

2. The device according to claim 1, wherein the first absorption layer absorbs said light at the first wavelength that is guided through the third waveguide better than the second absorption layer.

3. The device according to claim 1, wherein the first absorption layer abuts the first waveguide but not the second waveguide and the second absorption layer abuts the second waveguide but not the first waveguide.

4. The device according to claim 3, wherein the first, second and third waveguides have a common optical axis, and the first absorption layer and the second absorption layer are aligned along the common optical axis.

5. The device according to claim 4, wherein the first absorption layer abuts the second absorption layer along the common optical axis.

6. The device according to claim 4, further comprising a third absorption layer positioned away from and parallel to the waveguides.

7. The device according to claim 6, further comprising an anti-reflective layer disposed on the third absorption layer between the third absorption layer and the waveguides.

8. The device according to claim 6, further comprising a fourth absorption layer positioned away from and parallel to the waveguides.

9. The device according to claim 8, further comprising an anti-reflective layer disposed on the fourth absorption layer between the fourth absorption layer and the waveguides.

10. The device according to claim 1, further comprising an anti-reflective layer disposed on the second absorption layer of the third waveguide.

11. The device according to claim 1, further comprising an absorption layer disposed on the second waveguide for evanescently coupling with said light at the second wavelength that is guided through the second waveguide.

12. A device comprising a first section capable of emitting light at a first wavelength and including a first waveguide, a second section capable of detecting light at a second wavelength and including a second waveguide, and a middle section between the first and second sections including a third waveguide for absorbing stray light from the first section, the third waveguide including an absorption layer that absorbs stray light that is not guided through the third waveguide, better than stray light that is guided through the third waveguide.

13. The device according to claim 12, wherein the third waveguide includes an additional absorption layer that absorbs guided stray light better than unguided stray light.

14. The device according to claim 13, wherein the first, second and third waveguides have a common optical axis, and the absorption layer and the additional absorption layer are aligned along the common optical axis.

15. The device according to claim 14, wherein the absorption layer abuts the additional absorption layer along the common optical axis.

16. The device according to claim 12, wherein the absorption layer abuts the second waveguide but not the first waveguide.

17. The device according to claim 12, further comprising an additional absorption layer positioned away from and parallel to the waveguides.

18. The device according to claim 17, further comprising an anti-reflective layer disposed on the additional absorption layer between the additional absorption layer and the waveguides.

19. The device according to claim 12, further comprising an anti-reflective layer disposed on the absorption layer.

20. The device according to claim 12, further comprising an additional absorption layer disposed on the second waveguide for evanescently coupling with said light at the second wavelength that is guided through the second waveguide.

* * * * *